United States Patent [19]

Schindler

[11] Patent Number: 4,973,918

[45] Date of Patent: Nov. 27, 1990

[54] DISTRIBUTED AMPLIFYING SWITCH/R.F. SIGNAL SPLITTER

[75] Inventor: Manfred J. Schindler, Newton, Mass.

[73] Assignee: Raytheon Company, Lexington, Mass.

[21] Appl. No.: 290,713

[22] Filed: Dec. 27, 1988

[51] Int. Cl.$^5$ .............................. H03F 3/16; H03F 3/60
[52] U.S. Cl. ...................................... 330/277; 330/54; 330/286
[58] Field of Search ........................ 330/53, 54, 55, 57, 330/277, 286

[56] References Cited

U.S. PATENT DOCUMENTS

| | | | |
|---|---|---|---|
| 4,337,439 | 6/1982 | Sosin | 330/54 |
| 4,543,535 | 9/1985 | Ayasli | 330/53 |
| 4,668,920 | 5/1987 | Jones | 330/53 X |
| 4,772,858 | 9/1988 | Tsukii et al. | 330/277 |

*Primary Examiner*—Steven Mottola
*Attorney, Agent, or Firm*—Denis G. Maloney; Richard M. Sharkansky

[57] ABSTRACT

A distributed circuit includes a plurality of field effect transistors (FETS), each one of such FETS having gate, drain and source electrodes, with a first portion, or a first channel, of such FETS having gate electrodes and drain electrodes successively coupled between a first input terminal and a first ouput terminal, and a second like portion or a second channel of such FETS having gate electrodes and drain electrodes successively coupled between the first input terminal and a second output terminal. Separate bias circuits are provided to the input electrodes and the output electrodes of the first and second channels. Bias signals fed to the input bias circuits and coupled to the input electrodes to place the FETS in an "on" state to provide gain to r.f. input signals fed thereto, or in a "pinch-off" state to isolate r.f. signals fed to the input electrodes of the FETS. Accordingly, a 1×2 signal splitter or a 1×2 switch which provides gain to a signal is provided.

12 Claims, 2 Drawing Sheets

DISTRIBUTED AMPLIFYING SWITCH/R.F. SIGNAL SPLITTER

BACKGROUND OF THE INVENTION

This invention relates generally to radio frequency circuits and more particularly to radio frequency distributed circuits.

As is known in the art, radio frequency amplifiers configured as distributed amplifiers having a plurality of successively interconnected field effect transistors have been suggested to provide amplification of radio frequency signals.

Electronic Surveillance Measure Systems (ESM) are generally broadband systems, which must operate over various r.f. frequency bands to detect the presence of emitters. In such systems, it would be desirable to provide circuits which can split an incoming signal into two output signal portions, while providing gain over a broad range of operating frequencies.

SUMMARY OF THE INVENTION

In accordance with the present invention, a distributed amplifier switch and signal splitter includes a plurality of field effect transistors, each one of such field effect transistors having gate, drain and source electrodes, with each source electrode being coupled to a reference potential through a common radio frequency and direct current electrical path. A first portion or set of such field effect transistors is successively coupled between an input terminal and a first output terminal to provide a first channel. The gate electrode of each transistor in the first channel is successively electrically connected by a gate transmission line having a first end coupled to the input terminal, and a second end connected to a first circuit which provides a first switchable bias signal to the gate electrode. A second like portion of such field effect transistors is successively coupled between a first input terminal and a second output terminal to provide a second channel. The gate electrode of each transistor in the second channel is successively electrically connected by the gate transmission line having a first end coupled to the input terminal, and a second end connected to a second circuit which provides a second switchable bias signal to the gate electrode. The drain electrode of each one of the field effect transistors is interconnected by a common drain output transmission line, with the drain electrode of each field effect transistor of the first channel being coupled at a common junction along such output transmission line to the drain electrode of a corresponding one of each field effect transistor of the second channel. Preferably, electrical pathlengths between the first input terminal and the output terminal through each one of the field effect transistors of the first channel are substantially equal to the electrical pathlengths between the second input terminal and the output terminal through each one of the field effect transistors of the second channel. With such an arrangement, a circuit is provided which combines the functions of amplifying, switching, and splitting signals. This circuit accordingly eliminates the need for a circuit chain comprising individual amplifiers, switches, and power splitters, thereby improving system noise performance, reducing system cost and complexity. Further, since the first and second channels of transistor are successively coupled by transmission lines, the reactance of said lines may be taken into consideration to provide very broadband amplifying switch and r.f. signal splitting circuits.

BRIEF DESCRIPTION OF THE DRAWINGS

The foregoing features of the invention, as well as the invention itself, may be more fully understood from the following detailed description of the drawings, in which.

DESCRIPTION OF THE PREFERRED EMBODIMENT

Figure 1:
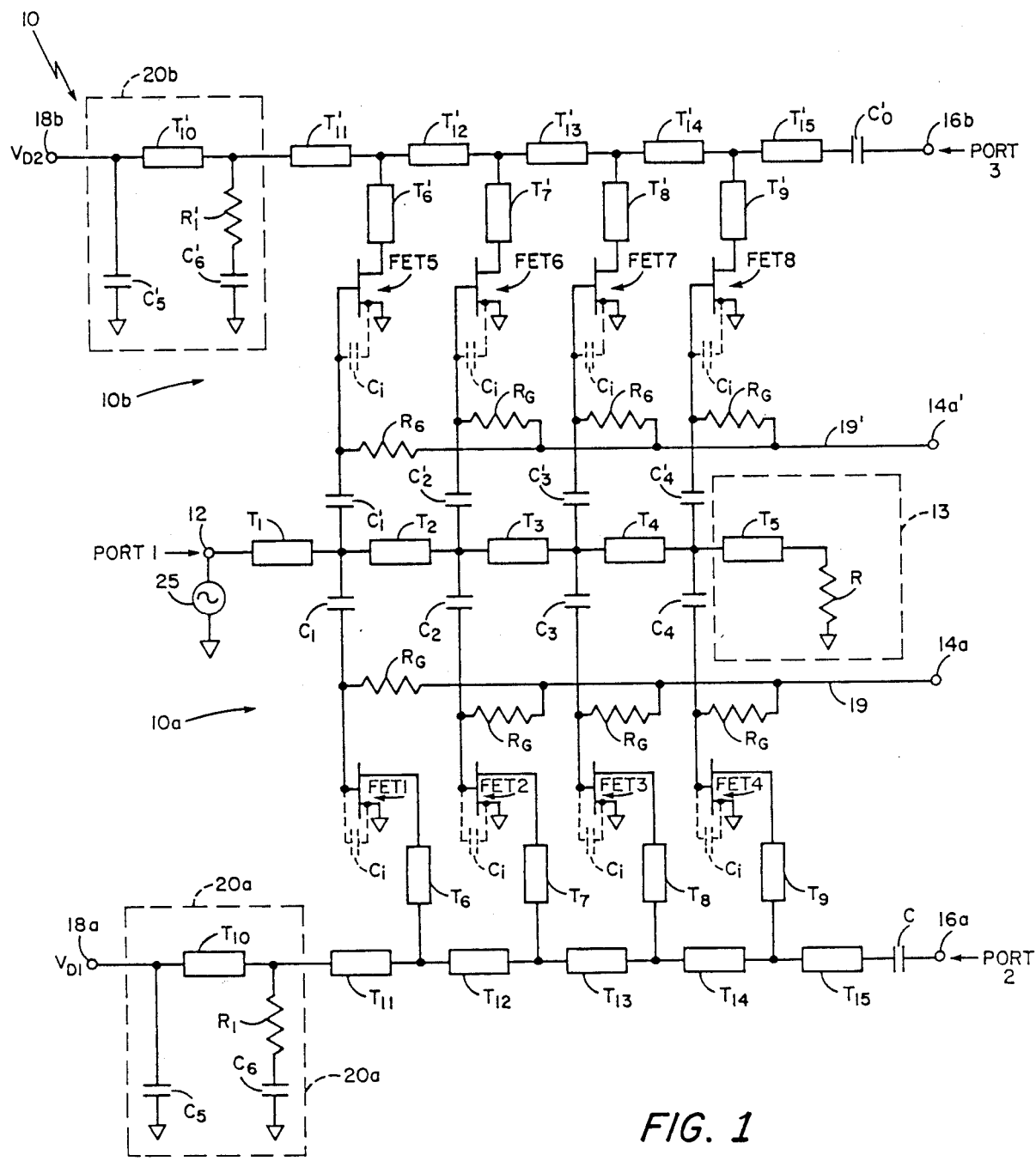
FIG. 1 is a schematic of an amplifier/switch/signal splitter in accordance with the present invention.

Referring now to FIG. 1, a distributed amplifier/switch/ signal splitter 10 is shown to include a plurality of channels, here 10a, 10b, with each channel 10a, 10b being interconnected between an input terminal 12 and a corresponding one of a pair of common output terminals 16a, 16b to provide amplification, switching, and r.f. signal splitting of a radio frequency signal fed to input terminal 12, with such signal selectively at the output terminals 24. Each one of the plurality of channels 21a, 21b includes a plurality of here four field effect transistors with FET 1, FET 2, FET 3, FET 4 being associated with channel 10a and with FET 5, FET 6, FET 7 and FET 8 being associated with channel 10b.

The field effect transistors FET 1 to FET 8 are here metal electrode semiconductor field effect transistors (MESFET) fabricated on gallium arsenide (not shown). The field effect transistors FET 1 to FET 4 here forming the first channel 10a have input electrodes, here gate electrodes $G_1$ to $G_4$ respectively successively electrically interconnected via transmission lines, here microstrip transmission lines $T_2$, $T_3$, $T_4$, respectively, and gate coupling capacitors $C_1$–$C_4$ as described in U.S. Pat. No. 4,543,535, and assigned to the assignee of the present invention. Capacitors $C_1$–$C_4$ and corresponding ones $C_1'$–$C_4'$ in the second channel permit the gates to share a common input line but separate bias lines, thus permitting independent switching without the need for switching the drain side of the circuit, as shown. The output electrodes, here drain electrodes $D_1$, $D_2$, $D_3$ and $D_4$ of such field effect transistors FET 1 to FET 4, respectively, are successively electrically interconnected via transmission lines, here microstrip transmission lines $T_{11}$–$T_{15}$ and $T_6$–$T_9$, as shown. Source electrodes $S_1$ to $S_4$ of the transistors FET 1 to FET 4, respectively, are coupled to a reference potential, here ground, through a common r.f. and D.C. electrical path, as shown. The gate electrode of the first one of the field effect transistors FET 1, here gate electrode $G_1$ of transistor FET 1 is connected via gate capacitor $C_1$ to the transmission line $T_1$ and coupled to input terminal 12, via transmission line $T_1$. The output electrode, i.e. drain electrode $D_1$ of the first field transistor FET 1 is coupled to a first drain DC bias circuit 20a, via transmission line here a microstrip transmission line $T_{11}$, as shown. A succeeding one of the field effect transistors, here the last or fourth field effect transistor FET 4, has input or gate electrode $G_4$ connected to a first gate DC bias/switch drive terminal 14a via capacitor $C_4$, as shown. The output or drain electrode $D_4$ of such transistor FET 4 is connected to the output terminal 16a through transmission line $T_{15}$ and a D.C. blocking capacitor C, as shown.

In a similar manner, the second channel 10b of the distributed amplifier/switch/signal splitter 10 includes field effect transistors (FET 5-FET 8), here also metal electrode semiconductor field effect transistors (MESFET) formed on a gallium arsenide substrate (not shown). The field effect transistors FET 5-FET 8 have input electrodes, here gate electrodes $G_5$-$G_8$, respectively, successively electrically interconnected via the transmission lines $T_2$-$T_4$, respectively, as indicated. The output electrodes, here drain electrodes $D_5$, $D_6$, $D_7$ and $D_8$ of such field effect transistors FET 5-FET 8, respectively, are successively electrically interconnected via transmission lines, here microstrip transmission lines $T_6'$-$T_9'$ and $T_{11}'$-$T_{15}'$, as shown. Thus, as shown in FIG. 1, the gate electrodes $G_1$-$G_8$ are coupled to a common, serially interconnected microstrip transmission line, comprised of microstrip transmission lines $T_1$-$T_5$ at common junctions 14a-14d, as shown. Source electrodes $S_5$-$S_8$ of transistors FET 5-FET 8, respectively, are coupled to a reference potential, here ground, through a common r.f. and DC electrical path, as shown. The output electrode i.e. drain electrode $D_1$ of the first field effect transistor FET 5 is coupled to a second drain DC bias circuit 18b, as shown, via the microstrip transmission line section $T_{11}'$. A succeeding one of the field effect transistors, here the last or fourth field effect transistor FET 8 has its drain electrode $D_8$ of such transistor FET 8 connected to a second output terminal 16b through transmission line $T_{15}$ and the DC blocking capacitor $C_0'$, as also shown.

It is noted that electrical pathlengths between the input terminal 12 and each of the output terminal 16a through field effect transistors FET 1-FET 4 are substantially equal to the electrical pathlengths between the input terminal 12b and output terminal 16b through each corresponding one of transistors FET 5-FET 8. That is, the lengths of the transmission line sections $T_1$-$T_4$, $T_1'$-$T_4'$, $T_{12}$-$T_{15}$, $T_{12}'$-$T_{15}'$, and $T_8$-$T_{10}$ used to interconnect field effect transistors FET 1-FET 8 and the phase or delay characteristics of FET 1-FET 8 are selected in combination to provide such equal electrical pathlengths.

Here input transmission line T' has a characteristic impedance of 50 ohms, and the impedance of lines $T_1$ to $T_4$ and $T_1'$ to $T_4'$ is chosen in accordance with the gate to source reactance $C_i$ (shown in phantom) of each one of the FETS to provide each of the channels 21a, 21b of the distributed amplifying switch/r.f. signal splitter 10 with an input impedance matched to the characteristic impedance of transmission lines T, T'

A pair of drain bias circuits 20a, 20b are provided here through a ladder network having two shunt pads to ground. Considering circuit 20a as exemplary, the shunt paths are provided by a capacitor $C_5$ and a resistor $R_1$ connected in series with capacitor $C_6$, with here a microstrip transmission line $T_{10}$ as a series element of such ladder network. The input terminals 18a, 18b are adapted for coupling to separate drain electrode DC bias sources $V_{D1}$, $V_{D2}$, as shown. Capacitors $C_5$ and $C_6$ and $C_5'$, $C_6'$ of circuit 20b provide low impedance shunt paths to ground for radio frequency signals, to prevent such radio frequency signals from being coupled to the DC bias source $V_{DD}$. A direct current path is provided through transmission line $T_{10}$. Since $R_1$ and $R_1'$ of circuit 20b are each capacitively coupled to ground, D.C. power is not dissipated by resistors $R_l$, $R_1'$. Thus, in example, direct current from drain bias source $V_{D1}$ is allowed to pass from terminal 18a through the strip conductors of microstrip transmission lines $T_{10}$-$T_{15}$ and $T_6$-$T_9$ and then return to ground through the grounded source electrodes.

The gate bias circuit 19 each have a common conductor having gate bias resistors connected at one end and said resistor $R_G$ connected at the other end to the gate electrode of said transistors. Capacitors $C_1$-$C_4$ and $C_1'$-$C_4'$ thus provide d.c. blocking for such circuit.

Since separate gate bias circuits are provided, they can be switched on/off independently to provide a switch/signal splitter without the need for modulating its drain bias which would be more difficult since drain currents are relatively large compared to that on the gate lines.

A second gate bias circuit 19' here also a common conductor connecting gate bias resistor $R_G$ is also provided, as shown.

In operation, an r.f. input signal from an r.f. source 25a is fed to input terminal 12, and via transmission lines $T_1$-$T_5$ and capacitors $C_1$-$C_4$ and $C_1'$-$C_4'$ is coupled to the gates $G_1$-$G_8$ of transistors FET 1-FET 4 and FET 5-FET 6. With input terminal 22a defined as port 1, output terminal 16a defined as port 2, and output terminal 16b defined as port 3, the input signal is selectively switched or is split and fed to both output terminals 16a, 16b. Transfer from port 1 to port 2 or port 3 is accomplished by applying a proper bias signal at terminals 14a, 14b.

To switch a signal from port 1 to port 2, a gate bias is fed to bias terminal 14a which turns "on" FETS 1-FET 4. Preferrable, the bias is applied so that the transistors FET 1-FET 4 are biased for maximum gain. The bias applied to 14b for the second channel is such that FET 5-FET 8 are biased at "pinch off". Accordingly, an amplified version of the signal fed to port 1 is provided at port 3.

Conversely, if transfer between port 2 and port 3 is desired, bias signals at terminals 14a' are selected to turn FET 5-FET 8 "on" whereas bias signals at terminals 14a are selected to "pinch off" FET 1-FET 4.

To use as an r.f. signal splitter, bias signals are fed to both terminals 14a and 14a' to bias both channels 10a, 10b of transistor in the "on" state. In this mode portion of the input signal at terminal 12 are fed to each of the resistors FET 1-FET 4 and FET 5-FET 8 are amplified and fed to respective output transmission line $T_6$-$T_{15}$ and $T_6'$-$T_{15}'$ to output terminals 16a, 16b. Thus, a pair of amplified versions of the signal fed to terminal 12 is provided at the outputs 16a, 16b. Capacitors $C_1$-$C_4$ and $C_1'$-$C_4'$ are selected to couple portions of the signal to the respective transistors. The capacitors are individual d.c. blocking capacitors which permit separate gate bias courses for each channel. Further, the capacitors can be used to improve power capabilities of the circuit in much the same way as outputs in U.S. Pat. No. 4,543,535.

Figure 2:
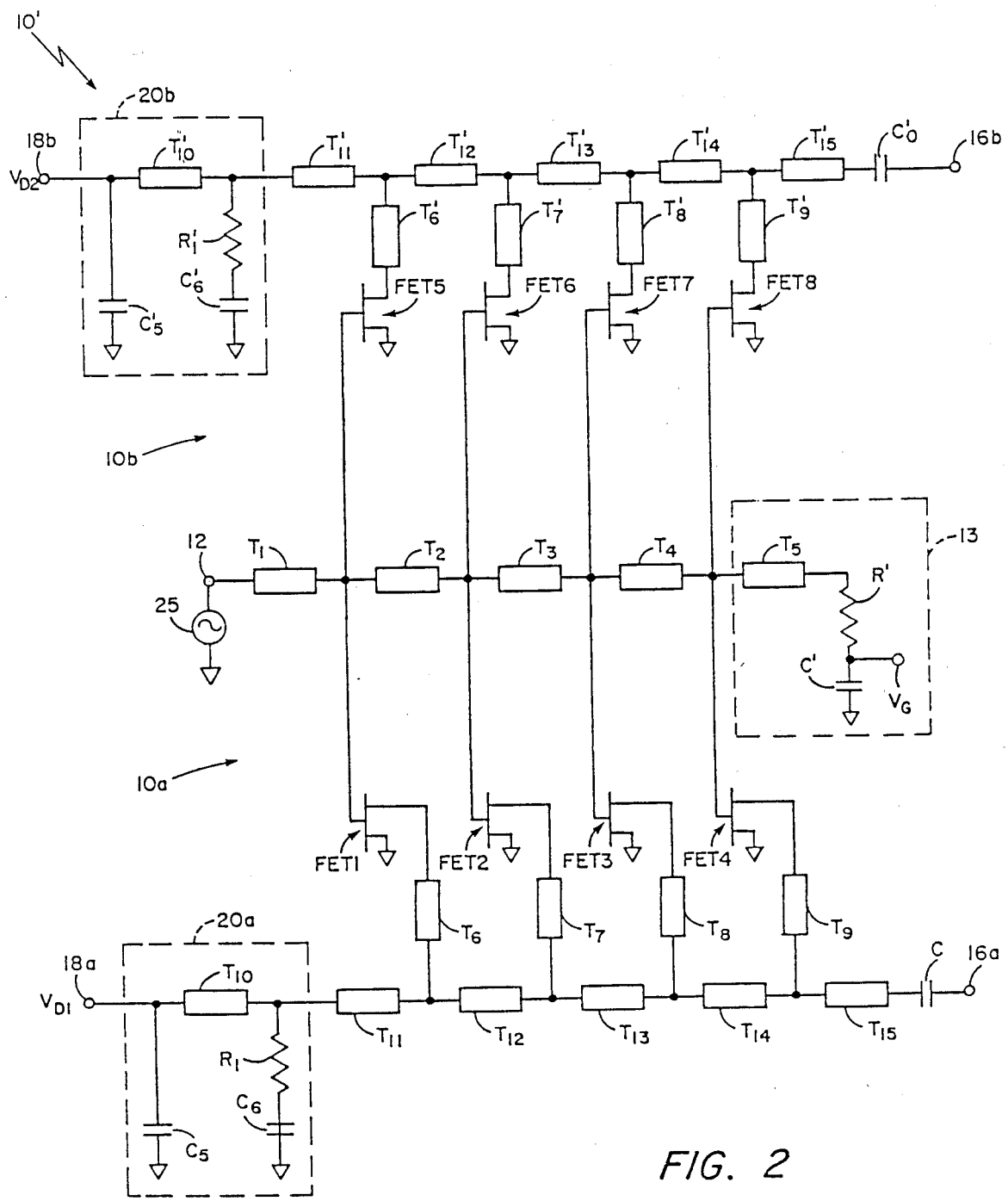
FIG. 2 is a schematic diagram of an alternate embodiment of the amplifier/switch/signal splitter having separate gate bias circuits.

Referring now to FIG. 2, an alternate embodiment of a distributed amplifying switch/signal splitter 10' is shown to include the channel 10a and 10b as previously described above in conjunction with FIG. 1. Here, however, gate electrodes of the transistors FET 1-FET 4 are connected at corresponding one other pair of junctions with the gate electrodes of FET 5-FET 8, as shown. The end of the common gate transmission line comprised of sections $T_1$-$T_5$ is coupled to the input terminal 12 via a d.c. blocking capacitor C, with the other end of said line being connected to a gate bias network 13, here a network comprised of a series connected capacitor C', and a resistor R', as shown. The capacitors $C_1$-$C_4$ and $C_1'$-$C_4'$ (FIG. 1) are not included in the embodiment shown in FIG. 2. That is, the gate electrodes of said transistors are directly coupled to the input transmission line. This particular arrangement provides a signal splitter having equivalent performances that are described in conjunction with FIG. 1 and the circuit is thus easier to fabricate without the need for the gate capacitors. However, in order for the amplifying switch/signal converter 10' to function as a switch, the drain biases $V_{D1}$ and $V_{D2}$ must be modulated since there is only one gate bias circuit, and accordingly, this arrangement is less desirable than the arrangement described in conjunction with FIG. 1 when a switching function is also required for the circuit.

With the elimination of the capacitors in this embodiment, the voltage portions fed to each one of the transistors are higher than the voltage fed to the corresponding transistors in the embodiment shown in FIG. 1. Thus, the total size of the transistors in the embodiment shown in FIG. 2 is less than the size of the transistors in the embodiment shown in FIG. 1. In either event, the gain imparted to the input signal to either of the embodiments shown in FIG. 1 or FIG. 2 can be substantially the same.

Having described a preferred embodiment of the invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A distributed amplifying switch and signal splitter circuit comprising:
    a common input transmission line;
    a first plurality of successively coupled transistors, each one thereof having an input electrode, an output electrode, and a grounded electrode, each of said transistors having the input electrode thereof coupled to an input terminal by said common input transmission line and a succeeding one of such transistors having the output electrode thereof coupled to a first output terminal;
    a second plurality of successively coupled transistors, each one thereof having an input electrode, an output electrode, and a grounded electrode a first one of such transistors having the input electrode thereof coupled to the input terminal by said input transmission line and a succeeding one of such transistors having the output electrode thereof coupled to a second output terminal;
    first coupling means for electrically interconnecting the output electrode of each one of said first plurality of transistors to the output terminal and for feeding a bias signal to each one of the output electrodes of said first plurality of transistors; and
    second coupling means for electrically interconnecting the output electrode of each one of said second plurality of transistors to the output terminal and for feeding a bias signal to each one of the output electrodes of said second plurality of transistors; and
    input electrode bias means for feeding a bias voltage to the input electrode of each one of the transistors.

2. The circuit of claim 1 wherein said input electrode bias means comprises:
    a first bias means for feeding a first bias voltage to each one of the first plurality of transistors, said bias means includes:
    means for capacitively coupling the input electrodes to the common transmission line;
    means for feeding a switchable d.c. bias to the input electrodes;
    a second bias means for feeding a second bias voltage to each one of the second plurality of transistors, said bias means includes:
    means for capacitively coupling the input electrodes to the common transmission line; and
    means for feeding a switchable d.c. bias to the input electrodes.

3. The circuit as recited in claim 2 wherein each capacitive coupling means is a plurality of capacitors, each one connected in series between one of the input electrodes and the common input transmission line.

4. The circuit as recited in claim 3 wherein the input electrode of each one of the first plurality of transistors is connected at a corresponding one of a plurality of common junctions at the common input line with the input electrode of each one of the second plurality of transistors.

5. The splitter circuit as recited in claim 4 wherein the common input transmission line coupling means includes a microstrip transmission line, with the common junctions spaced along said microstrip transmission line.

6. The circuit as recited in claim 5 wherein each transistor includes a reactive element between the input electrode and grounded electrode and wherein the input transmission line includes a first microstrip transmission line having a characteristic impedance in accordance with the impedance of the reactive element of each transistor and the impedance of the series capacitor to provide the circuit with a predetermined output impedance.

7. The circuit as recited in claim 6 further comprising a second microstrip transmission line electrically successively interconnecting each one of the output electrodes of the first plurality of transistors to the first output terminal, and a third microstrip transmission line for electrically successively interconnecting each one of the output electrodes of the second plurality of transistors to the second output terminal.

8. The circuit as recited in claim 7 wherein an input signal is fed to the input terminal and said first and second bias means feed bias signals to selectively switch the corresponding first and second pluralities of transistor on and off to selectively provide first and second amplified portions of said input signal to respective ones of said first and second output terminal.

9. The circuit of claim 8 further comprising first and second output bias circuits where the first and second bias means each include two series connected resistors and a capacitor connected between the connection of the resistors and ground.

10. A distributed circuit comprising:
    a first plurality of successively coupled field effect transistors having successively connected gate electrodes, and successively connected drain electrodes, a first one of such field effect transistors having the gate electrode thereof coupled to a first input terminal and fed by a first portion of a first radio frequency signal, and the last one of the successively coupled field effect transistors having the drain electrode thereof coupled to an output terminal for producing a last amplified portion of the first radio frequency signal;

a second like plurality of successively coupled field effect transistors having successively connected gate electrodes, successively connected drain electrodes, a first one of such field effect transistors having the gate electrode thereof coupled to the input terminal and fed by a second portion of the radio frequency signal, and the last one of the successively coupled field effect transistors having the drain electrode thereof coupled to a second output terminal for producing a last amplified portion of the second radio frequency signal portion;

a common coupling means, including first and second pluralities of capacitors for electrically interconnecting the gate electrode of each one of the field effect transistors to the input terminal of the distributed circuit, with the gate electrode of each one of the first plurality of transistors being connected at a corresponding one of a plurality of common junctions with the input electrode of each one of the second plurality of transistors;

first gate bias means for feeding a first bias to the input electrode of the first plurality of transistors;

second gate bias means for feeding a second bias to the input electrode of the second plurality of transistor: and wherein said first and second gate bias means feed bias signals which selectively switch the corresponding first and second pluralities of transistors on and off to selectively provide first and second amplified portions of said input radio frequency signal to respective ones of said first and second output terminals.

11. The distributed circuit as recited in claim 10 wherein the common coupling means includes a microstrip transmission line.

12. The distributed circuit as recited in claim 11 further comprising:

a first output coupling means for electrically successively interconnecting each one of the successively connected drain electrodes of the first plurality of field effect transistors to the first output terminal; and a second output coupling means for electrically successively interconnecting each one of the gate electrodes of the second plurality of field effect transistors to the second input terminal.

* * * * *